(12) United States Patent
Niederl et al.

(10) Patent No.: US 10,897,261 B1
(45) Date of Patent: Jan. 19, 2021

(54) ANALOG-TO-DIGITAL CONVERTER WITH A SUPPLEMENTARY DIGITAL-TO-ANALOG CONVERTER FOR OFFSET AND GAIN ERROR MEASUREMENTS

(71) Applicant: Infineon Technologies AG, Neubiberg (DE)

(72) Inventors: Josef Niederl, Klagenfurt-Wölfnitz (AT); Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/810,280

(22) Filed: Mar. 5, 2020

(51) Int. Cl.
*H03M 1/10* (2006.01)

(52) U.S. Cl.
CPC .................. *H03M 1/1071* (2013.01)

(58) Field of Classification Search
CPC .................................. H03M 1/1071
USPC .................................. 341/120–155
See application file for complete search history.

(56) References Cited

U.S. PATENT DOCUMENTS

| | | | | |
|---|---|---|---|---|
| 8,125,262 B2* | 2/2012 | Kusuda | .................. | G06G 7/186 327/337 |
| 8,614,639 B1* | 12/2013 | Yin | .................. | H03M 1/56 341/169 |
| 8,860,592 B2* | 10/2014 | Mattes | .................. | H03M 1/1009 341/120 |
| 9,035,693 B2* | 5/2015 | Pan | .................. | H03F 1/34 327/538 |
| 9,218,514 B2* | 12/2015 | Kim | .................. | H03M 3/496 |
| 9,787,291 B1 | 10/2017 | Reindl et al. | | |
| 2009/0298448 A1* | 12/2009 | Mayer | .................. | H04W 52/52 455/127.2 |
| 2009/0319211 A1* | 12/2009 | Bresch | .................. | H03M 1/1095 702/65 |
| 2014/0043031 A1* | 2/2014 | Kain | .................. | G01R 31/396 324/433 |
| 2014/0333464 A1* | 11/2014 | Mattes | .................. | H03M 1/109 341/155 |
| 2017/0099062 A1* | 4/2017 | Vagni | .................. | H03M 1/1071 |

* cited by examiner

Primary Examiner — Lam T Mai
(74) Attorney, Agent, or Firm — Slater Matsil, LLP

(57) ABSTRACT

A switched-capacitor analog-to-digital converter (ADC) includes: a main digital-to-analog converter (DAC) circuit; a comparator coupled to the main DAC circuit and configured to determine whether the input to the comparator exceeds a pre-determined threshold; and a supplementary DAC circuit coupled to the main DAC circuit, wherein the switched-capacitor ADC is configured to operate in at least one of a first mode or a second mode, wherein in the first mode for measuring an offset of the switched-capacitor ADC, the supplementary DAC circuit is configured to shift a voltage at an output of the main DAC circuit by a first value having a first polarity, and wherein in the second mode for measuring a full-scale gain error of the switched-capacitor ADC, the supplementary DAC circuit is configured to shift the voltage at the output of the main DAC circuit by a second value having a second polarity opposite the first polarity.

20 Claims, 11 Drawing Sheets

1000

Shift a DC transfer curve of a switched-capacitor ADC in a first direction by a pre-determined value during measurement of an offset of the switched-capacitor ADC with a zero-voltage input  ⸺1001

Shift the DC transfer curve of the switched-capacitor ADC in a second direction opposite the first direction by the pre-determined value during measurement of a full-scale gain error of the switched-capacitor ADC with a full-scale voltage input  ⸺1002

Fig. 7

ANALOG-TO-DIGITAL CONVERTER WITH A SUPPLEMENTARY DIGITAL-TO-ANALOG CONVERTER FOR OFFSET AND GAIN ERROR MEASUREMENTS

TECHNICAL FIELD

The present invention relates generally to analog-to-digital converters (ADCs), and, in particular embodiment, to an ADC with a built-in supplementary digital-to-analog converter (DAC) that shifts the direct-current (DC) transfer curve of the ADC to facilitate measurements of the offset and the gain error (e.g., full-scale gain error) of the ADC.

BACKGROUND

Analog-to-digital converters (ADCs) are broadly used in electronic systems to convert analog signals, such as electrical voltages or electrical currents, into digital signals for processing in digital systems. Various types of ADCs are available, such as direct-conversion ADC, successive approximation ADC (SARADC), sigma-delta ADC, or the like.

After being manufactured, an ADC is tested to verify its functionality, and to verify that the ADC parameters are within target specifications. ADC devices are usually tested using automatic test equipment (ATE) to reduce testing time. For low-cost ADC devices, the testing time is a major factor in determining the manufacturing cost of the device. To test high accuracy ADCs, current ADC testing process usually requires high accuracy test equipment and long testing/calculation time.

SUMMARY

In accordance with an embodiment of the present invention, a switched-capacitor analog-to-digital converter (ADC) includes: a main digital-to-analog converter (DAC) circuit having an output; a comparator having an input coupled to the output of the main DAC circuit, the comparator configured to determine whether the input to the comparator exceeds a pre-determined threshold; and a supplementary DAC circuit coupled to the main DAC circuit, wherein the switched-capacitor ADC is configured to operate in at least one of a first mode or a second mode, wherein in the first mode for measuring an offset of the switched-capacitor ADC with a zero voltage input, the supplementary DAC circuit is configured to shift a voltage at the output of the main DAC circuit by a first value having a first polarity, and wherein in the second mode for measuring a full-scale gain error of the switched-capacitor ADC with a full-scale input voltage, the supplementary DAC circuit is configured to shift the voltage at the output of the main DAC circuit by a second value having a second polarity opposite the first polarity.

In accordance with an embodiment of the present invention, a switched-capacitor analog-to-digital converter (ADC) includes: a main digital-to-analog converter (DAC) circuit having an output; a comparator coupled to the output of the main DAC circuit; and a supplementary DAC circuit. The supplementary DAC circuit comprises: at least one supplementary capacitor, wherein a first terminal of the at least one supplementary capacitor is coupled to the output of the main DAC circuit; a first switch coupled between a second terminal of the at least one supplementary capacitor and a first reference voltage terminal of the switched-capacitor ADC; and a second switch coupled between the second terminal of the at least one supplementary capacitor and a second reference voltage terminal of the switched-capacitor ADC.

In accordance with an embodiment of the present invention, a method of operating a switched-capacitor analog-to-digital converter (ADC) includes at least one of: shifting a DC transfer curve of the switched-capacitor ADC in a first direction by a pre-determined value during measurement of an offset of the switched-capacitor ADC with a zero-voltage input; and shifting the DC transfer curve of the switched-capacitor ADC in a second direction opposite the first direction by the pre-determined value during measurement of a full-scale gain error of the switched-capacitor ADC with a full-scale voltage input.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 illustrates a flow chart of a method of operating an ADC device, in an embodiment.

DETAILED DESCRIPTION OF ILLUSTRATIVE EMBODIMENTS

Figure 1:
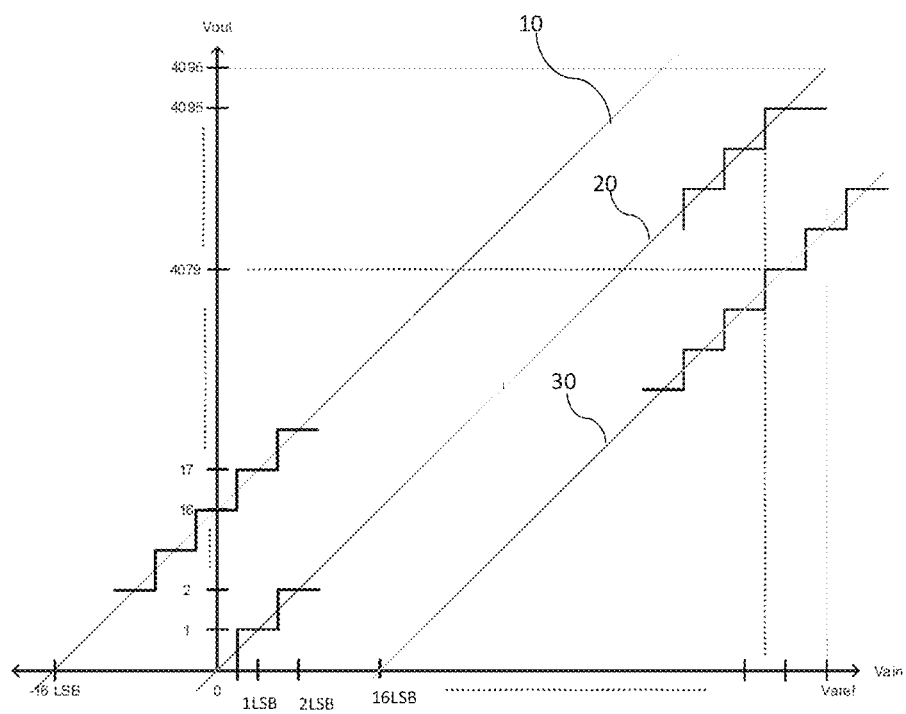
FIG. 1 shows three DC transfer curves, in an embodiment.

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to example embodiments in a specific context, namely an ADC with a built-in supplemental DAC circuit that shifts the DC transfer curve upward and downward to facilitate simple and quick measurements of the offset and the full-scale gain error of the ADC, respectively.

In an embodiment of the present invention, an ADC comprises a main DAC circuit, a comparator coupled to an output of the main DAC circuit, and a supplementary DAC circuit coupled to the main DAC circuit. During a normal operation mode, the supplementary DAC circuit is deactivated. During measurement of the offset of the ADC with a zero-voltage input, the supplementary DAC circuit is activated to shift the DC transfer curve of the ADC upward by a pre-determined value, thereby leaving room for both negative offset and positive offset to be measured with a zero-voltage input. During measurement of the full-scale gain error of the ADC with a full-scale input, the supplementary DAC circuit is activated to shift the DC transfer curve of the ADC downward by a pre-determined value, thereby leaving room for both negative offset and positive offset to be measured with a full-scale input voltage.

A linear ramp test is typically used for measuring the full-scale gain error and the offset of an ADC (also referred to as an ADC device). In the linear ramp test, a high-accuracy ramp signal is generated using automatic test equipment (ATE). Typically, additional hardware is installed on the ATE to provide an accurate analog source to generate the high-accuracy ramp signal. The ramp signal is applied to the input of the ADC, and the digital results from the ADC are stored in a histogram. Mathematical post processing of the histogram delivers various ADC parameters, like Integral Non-Linearity (INL), Differential Non-Linearity (DNL), full-scale gain error and offset.

While an ideal ramp signal is a linear signal (e.g., a sloped line), in reality the ramp signal generated by the test equipment may be a stair function (e.g., stairs along a sloped line), where each stair has a sub-LSB height (e.g., voltage level). Throughout the discussion herein, when used to represent a voltage level, LSB means the analog voltage level that corresponds to an LSB of the ADC output. For example, for a 12-bit ADC and a full-scale input voltage $V_{AREF}$ (e.g., a voltage that causes a full-scale ADC output of 4095), an LSB voltage may be calculated as Varef/4096.

Due to the non-ideal ramp signal (e.g., a stair function), the linear ramp test requires several conversions for each ramp step to achieve noise suppression, which results in a longer test time. For example, for a 10-bit ADC with a step size of ¼ LSB, if every step is converted 30 times, this would require 1024×4×30 conversions, which results in long measurement time in addition to the requirement of a high-precision analog source instrument on the ATE. The present disclosure discloses an ADC that allows for simple and quick measurement of the full-scale gain error and the offset of the ADC without the need for high-accuracy test equipment. Details are discussed hereinafter.

FIG. 1 shows three DC transfer curves, in an embodiment. The curve 20 in FIG. 1 shows an ideal DC transfer curve, which shows the ideal relationship between the input analog voltage (in units of LSB volt) and the output of the ADC. The output of the ADC, which is a multi-bit digital output (e.g., a 12-bit output for a 12-bit ADC), is also referred to as the output code of the ADC, or the ADC output code. As illustrated in FIG. 2B, the curve 20 is a linear line such that a zero input voltage results in an ADC output code of zero, an input voltage of 1 LSB volt results in an ADC output code of 1, and so on.

The offset (may also be referred to as the offset error) and the full-scale gain error of the ADC may be measured as the zero-crossing point and the full-scale (FS) crossing point, respectively. To measure the offset of the ADC, an input voltage of zero volts (e.g., electrical ground) is applied to the input of the ADC, the output of the ADC (e.g., a non-zero value) is the offset of the ADC. To measure the full-scale gain error of the ADC, a positive reference voltage (e.g., a full-scale input voltage such as a positive power supply voltage) is applied to the input of the ADC, the difference between the output of the ADC and the full-scale ADC output code (e.g., the maximum ADC output) is the full-scale gain error of the ADC. However, with a zero-volt input, if the offset is negative, underflow of the ADC will happen. Similarly, with a full-scale input voltage, if the offset is positive, overflow of the ADC will happen. Full-scale gain error and offset calculations based on measurements that cause an underflow or an overflow of the ADC might be subject to inaccuracies.

For the above reasons, an ADC test process without the current disclosure may have to obtain the offset and the full-scale gain error of the ADC through extrapolation. For example, the ADC test process may measure the output of the ADC at many different input voltage levels between the zero-volt input and the full-scale input, and use the measurements to plot a partial DC transfer curve (e.g., a curve without the data point at the zero-volt input and the full-scale input). The partial DC transfer curve is then extrapolated (e.g., through linear extrapolation) to get an estimate of the offset and the full-scale gain error of the ADC.

The present disclosure allows direct measurement of the offset (or the full-scale gain error) of the ADC through one single measurement at the zero-volt input (or at the full-scale input voltage). In particular, when measuring the offset of the ADC, an upward shift of the DC transfer curve of the ADC is introduced to shift the zero-crossing point along the y-axis (see curve 10 in FIG. 1) to a point where positive and negative offsets are possible. In other words, an artificial offset is introduced to allow measurements in a window around the zero input voltage. The curve 10 in FIG. 1 shows an example of a modified DC transfer curve of the ADC. For offset measurements the DC transfer curve is shifted upwards by, e.g., +16. In other words, sampling a zero-volt input voltage (e.g., electrical ground) would result in an ideal ADC output code of +16. Deviation of the ADC output from this code (e.g., +16) gives directly the offset of the ADC. In the discussion herein, the above described offset measurement mode (e.g., with the shifted DC transfer curve) may also be referred to as a modified zero-crossing mode or a modified zero-crossing operation mode.

Similarly, for the measurement of the full-scale gain error of the ADC, the DC transfer curve is shifted downward to have a negative zero-crossing point along the y-axis (see curve 30 in FIG. 1). The curve 30 in FIG. 1 illustrates an example of the down-shifted DC transfer curve, where the DC transfer curve is shifted downward by, e.g., +16. For example, with the down-shifted DC transfer curve, an ideal 12-bit ADC will convert a reference voltage (e.g., a full-scale input voltage) to an ADC output code of 4079. Deviation of the ADC output from this code (e.g., 4079) gives directly the full-scale gain error. One skilled in the art will ready appreciate that the shift value 16 is used in the above discussion as a non-limiting example of the amount of shift in the DC transfer curve. Other suitable values are also possible and are fully intended to be included within the scope of the present disclosure. In the discussion herein, the above described full-scale gain error measurement mode (e.g., with the shifted DC transfer curve) may also be referred to as a modified full-scale crossing mode or a modified full-scale crossing operation mode.

Figure 2A:
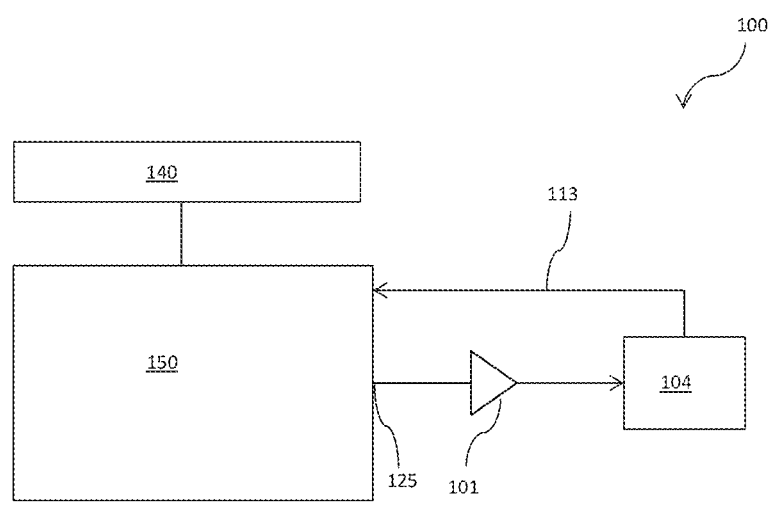
FIG. 2A is a block diagram of an ADC, in an embodiment.
Figure 2B:
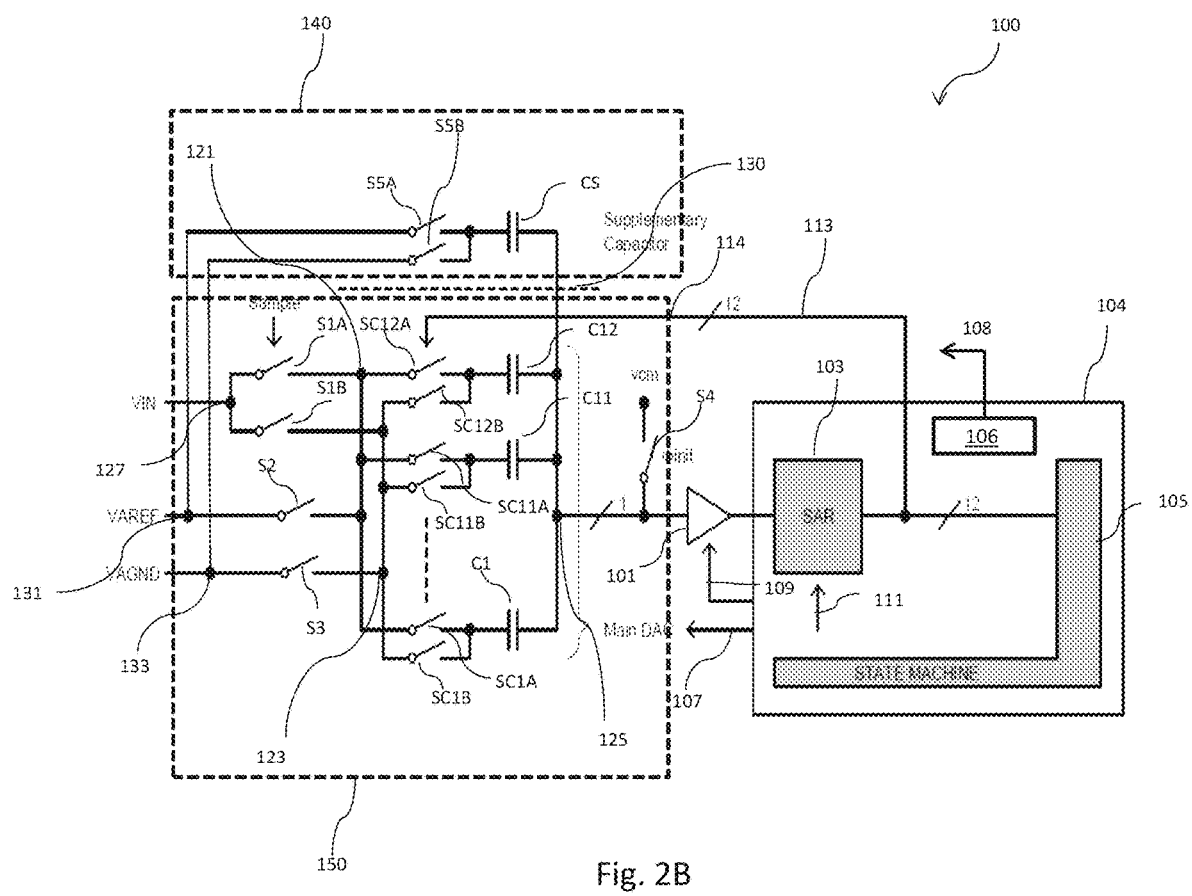
FIG. 2B is a detailed block diagram of the ADC in FIG. 2A, in an embodiment.

FIG. 2A is a block diagram of an ADC 100, in an embodiment. The ADC 100 is configured to shift the DC transfer curve upward and downward for measurements of the offset and the full-scale gain error of the ADC, respectively. FIG. 2B is a detailed diagram of the ADC 100 in FIG. 2A, in an embodiment. Various operation modes of the ADC 100 are discussed with reference to FIGS. 3A, 3B, 4A, 4B, 5A, and 5B. For simplicity, not all features of the ADC 100 are illustrated in FIG. 2B.

Referring to FIG. 2A, the ADC 100 is a switched-capacitor ADC and includes an ADC circuit 104 (e.g., a successive approximation register (SAR) circuit), a comparator 101, a main digital-to-analog converter (DAC) circuit 150, and a supplementary DAC circuit 140. The main DAC circuit 150 is electrically coupled to the supplementary DAC 140. The comparator 101 has an input coupled to an output 125 of the main DAC circuit 150, and has an output coupled to the ADC circuit 104. The comparator 101 is configured to determine whether the input to the comparator 101 exceeds a threshold voltage of the comparator 101. The ADC circuit 104 may control the operation of the main DAC circuit 150 through signal path 113. The ADC 100 may be configured to operate in a first mode or a second mode, wherein in the first mode for measuring an offset of the ADC 100 with a zero voltage input, the supplementary DAC circuit 140 is configured to shift a voltage at the output 125 of the main DAC circuit 150 by a first value having a first polarity, and wherein in the second mode for measuring a full-scale gain error of the ADC 100 with a full-scale input voltage, the supplementary DAC circuit 150 is configured to shift the voltage at the output 125 of the main DAC circuit 150 by a second value having a second polarity opposite the first polarity. Details of the ADC 100 are discussed below.

Referring now to FIG. 2B, which is a detailed block diagram of the ADC 100 of FIG. 2A, in an embodiment. In the illustrated embodiment, the ADC 100 is a switched-capacitor ADC. In the example of FIG. 2B, a successive approximation (SAR) ADC is used as an example of the switched-capacitor ADC, with the understanding that a switched-capacitor ADC may be other types of ADC, such as a flash ADC, a pipeline ADC, or a tracking ADC. FIG. 2B uses a SAR ADC as a non-limiting example, one skilled in the art, upon reading the current disclosure, will be able to readily apply the principles disclosed herein to other types of ADC.

In FIG. 2B, the ADC 100 includes a successive approximation register (SAR) circuit 104, a comparator 101, a main digital-to-analog converter (DAC) circuit iso, and a supplementary DAC circuit 140. The supplementary DAC circuit 140 and the main DAC circuit 150 are disposed above and below the dashed line 130 in FIG. 2B, respectively. For ease of discussion and without loss of generality, the discussion below uses an example where the ADC 100 is a 12-bit ADC. One skilled in the art, upon reading the disclosure herein, will be able to readily apply the principle disclosed herein for an ADC with any number of output bits.

In FIG. 2B, the SAR circuit 104 includes a successive approximation register (SAR) 103, a switch control circuit 106, and a logic circuit 105 (e.g., a state machine). The SAR 103 stores the ADC output code when the analog-to-digital conversion is finished, and stores intermediate ADC output codes during the successive approximation process. The logic circuit 105, based on the output of the comparator 101, produces a sequence of ADC output codes that are stored sequentially in the SAR 103 during the successive approximation process. The logic circuit 105 may control operation of the SAR 103 through signal path 111. The switch control circuit 106 generates control signals (e.g., on signal paths 108) that are configured to control the status (e.g., open or close) of various switches of the ADC 100 (e.g., switches in FIG. 2B other than the paired switches SC1A/SC1B, . . . , SC11A/SC12B). The switch control circuit 106 may be implemented as part of the logic circuit 105, in some embodiments. Each bit of the ADC output code stored in the SAR 103 is used to control the status (e.g., open or close) of a respective paired switch during the successive approximation process, details are discussed hereinafter. FIG. 2B further illustrates a master latch signal (e.g., a clock signal) 109 and a steering signal 107, where the steering signal 107 may send contents of the SAR 103 to the main DAC circuit 150.

The main DAC circuit 150 includes an array of capacitors $C_1$, $C_2$, . . . , and $C_N$, where N is the number of bits in the ADC output code. In the example of FIG. 2B, a 12-bit ADC is used, thus N=12, and the capacitors $C_1$, $C_2$, . . . , and $C_N$ are binary-weighted (also referred to as binary-coded). Here binary-weighted means that the capacitance of the capacitor $C_n$ is $2^{n-1} \times C$, wherein n=1, 2, . . . , N, and C is a pre-determined capacitance value. For the 12-bit ADC, the capacitors $C_1$, $C_2$, . . . , and $C_{12}$ have the following capacitances: $C_1=C$, $C_2=2 \times C$, . . . , $C_{12}=2^{11} \times C$. Binary-coded capacitors are used as non-limiting examples of the capacitors $C_1$, $C_2$, . . . , and $C_N$ in FIG. 2B, other suitable capacitors, such as redundant coded or thermometer coded capacitors, may also be used as the capacitors $C_1$, $C_2$, . . . , and $C_N$, as one skilled in the art would readily appreciate. This discussion below uses the binary-coded capacitors as an example.

As illustrated in FIG. 2B, a first terminal (e.g., the right terminal in FIG. 2B) of each capacitor $C_n$ of the array of binary-weighted capacitors is coupled to an output node 125 (also referred to as an output) of the main DAC circuit 150. A second terminal (e.g., the left terminal in FIG. 2B) of each capacitor $C_n$ of the array of binary-weighted capacitors is coupled to a pair of switches $SC_{nA}$ and $SC_{nB}$, where n=1, 2, . . . , N. For ease of description, the pair of switches $SC_{nA}$ and $SC_{nB}$ may be referred to as a paired switch. As will be discussed in more details hereinafter, at different phases (e.g., sampling phase, or conversion phase) of operation of the ADC 100 (e.g., a successive approximation ADC), each of the switches $SC_{nA}$ and $SC_{nB}$ may be open or closed to electrically couple each capacitor $C_n$ to an input voltage terminal Vin, a first reference voltage terminal $V_{AREF}$, or a second reference voltage terminal $V_{AGND}$. The first reference voltage terminal $V_{AREF}$ is configured to be connected to a full-scale input voltage, and the second reference voltage terminal $V_{AGND}$ is configured to be connected to an electrical ground, in the illustrated embodiment. In some embodiments, the first reference voltage terminal $V_{AREF}$ is configured to be connected to a positive reference voltage, and the second reference voltage terminal $V_{AGND}$ is configured to be connected to a negative reference voltage. During the conversion phase of the ADC operation, each paired switch is controlled (e.g., through signal path 113 that is coupled to an input 114 of the main DAC circuit iso) by a respective bit in the ADC code stored in the SAR 103, details are discussed hereinafter.

As illustrated in FIG. 2B, a first terminal (e.g., the right side terminal in FIG. 2B) of each switch $SC_{nA}$ is electrically coupled to the capacitor $C_n$, n=1, 2, . . . , N, and a second terminal (e.g., the left side terminal in FIG. 2B) of each switch $SC_{nA}$ is electrically coupled to a node 121, which node 121 is electrically coupled to a switch $S_{1A}$ and a switch $S_2$. Depending on the status (e.g., open or close) of the switches $S_{1A}$ and $S_2$, the node 121 may be connected to the input voltage terminal VIN or the first reference voltage terminal $V_{AREF}$ at different phases of operation.

Still referring to FIG. 2B, a first terminal (e.g., the right side terminal in FIG. 2B) of each switch $SC_{nB}$ is electrically coupled to the capacitor $C_n$, and a second terminal (e.g., the left side terminal in FIG. 2B) of each switch $SC_{nB}$ is electrically coupled to a node 123, which node 123 is electrically coupled to a switch $S_{1B}$ and a switch $S_3$. Depending on the status (e.g., open or close) of the switches $S_{1B}$ and $S_3$, the node 123 may be connected to the input voltage terminal VIN or the second reference voltage terminal $V_{AGND}$ at different phases of operation.

The main DAC circuit 150 further includes a switch S4. The switch S4 is closed during the sampling phase of the operation of the ADC 100, and is open during the conversion phase of the operation of the ADC 100. A first terminal (e.g., the lower terminal in FIG. 2B) is electrically coupled to the output node 125, and a second terminal (e.g., the upper terminal in FIG. 2B) is electrically coupled to a low-bias voltage terminal $V_{cm}$. The low-bias voltage terminal $V_{cm}$ is configured to be coupled to a low-bias voltage, which low-bias voltage is chosen to set the comparator 101 to a proper bias condition. The bias voltage may be chosen depending on, e.g., the supply voltage of the comparator 101 and the type of transistor used. In some embodiments, a common voltage is generated for use as the bias voltage.

The supplementary DAC circuit 140 includes a supplementary capacitor CS, and a paired switch that includes switches $S_{5A}$ and $S_{5B}$. Depending on the status (e.g., open or close) of the switches $S_{5A}$ and $S_{5B}$, the supplementary capacitor CS may be connected to first reference voltage terminal $V_{AREF}$ or the second reference voltage terminal $V_{AGND}$ at different phases of operation. The capacitance of the supplementary capacitor CS determines the amount of upward shift or downward shift of the DC transfer curves 10 and 30, in the illustrated embodiment. To move the DC transfer curve upward (or downward) by M, the capacitance of the supplementary capacitor CS is chosen as M×C. For example, for an upward or a downward shift amount of 16 for the DC transfer curve, the capacitance of the supplementary capacitor CS is chosen as 16C. While the supplementary capacitor CS is illustrated in the block diagram of FIG. 2B as a single capacitor, for implementation in circuits, the supplementary capacitor CS may be implemented as a plurality of capacitors (see, e.g., discussion below with reference to FIG. 6). In some embodiments, the supplementary DAC circuit 140 includes more than one capacitors.

The supplementary DAC circuit 140 is built with the same type of capacitor as the capacitors in the main DAC circuit 150, and may therefore achieve the same accuracy as the main DAC circuit 150. This supplementary DAC circuit 140 is very small (e.g. one capacitor and a few switches) and may be also be used for other purposes during measurement, e.g. window tracking of DC signals.

The comparator 101 is coupled between the output 125 of the main DAC circuit 150 and the SAR circuit 104. In the illustrated embodiment, the comparator 101 compares the voltage at the output 125 of the main DAC circuit with a threshold voltage of the comparator 101, which threshold-voltage may be a trip point of the comparator 101 set during the sampling phase of the operation of the ADC 100. During the conversion phase of operation, the output of the comparator 101 is sent to the SAR circuit 104, and based on the output of the comparator 101, the SAR circuit 104 decides whether the current ADC bit should be set to zero or one, as discussed below.

Operation of the ADC 100 in the normal mode (may also be referred to as normal operation mode) is discussed below with reference to FIGS. 3A and 3B. In the normal mode, the ADC 100 is configured to convert (or measure) the analog input voltage at the input voltage terminal VIN into a digital output code (e.g., a 12-bit ADC output). Other modes of operation (e.g., for measuring offset and full-scale gain error) are discussed with reference to FIGS. 4A, 4B, 5A, and 5B.

Figure 3A:
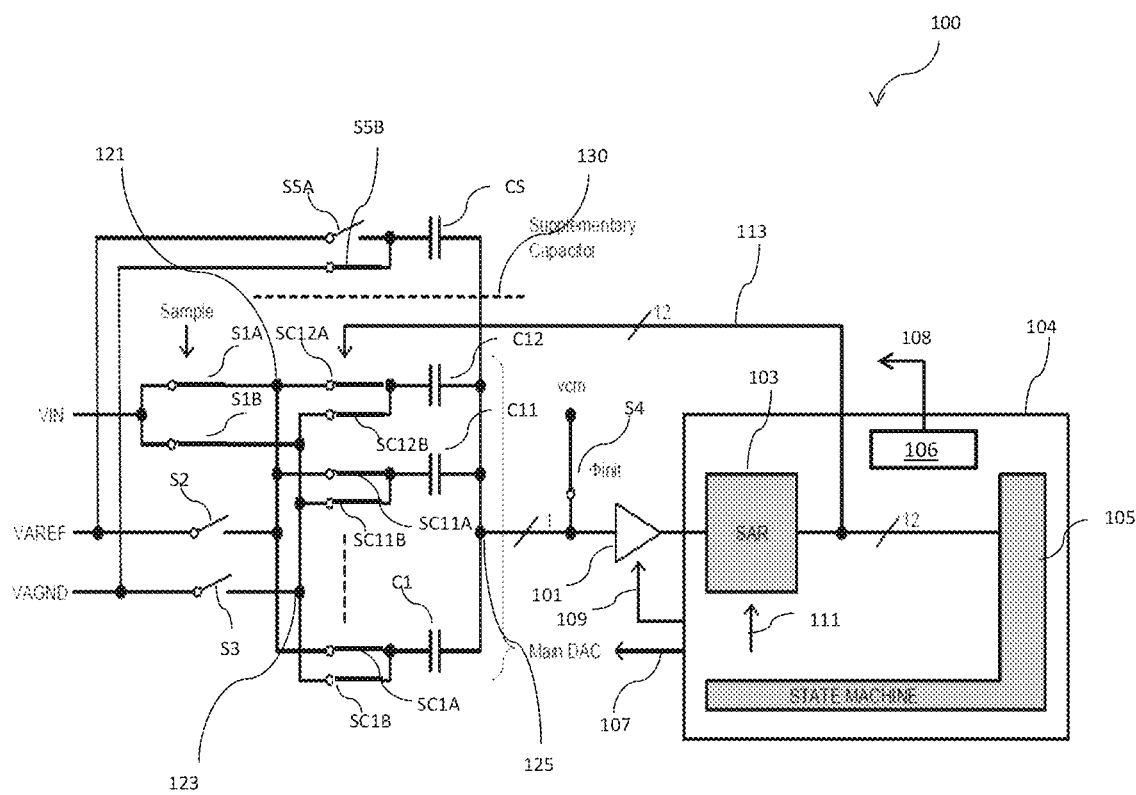
FIGS. 3A and 3B illustrate the sampling phase and the conversion phase, respectively, of a normal operation mode of the ADC of FIG. 2B, in an embodiment.
Figure 3B:
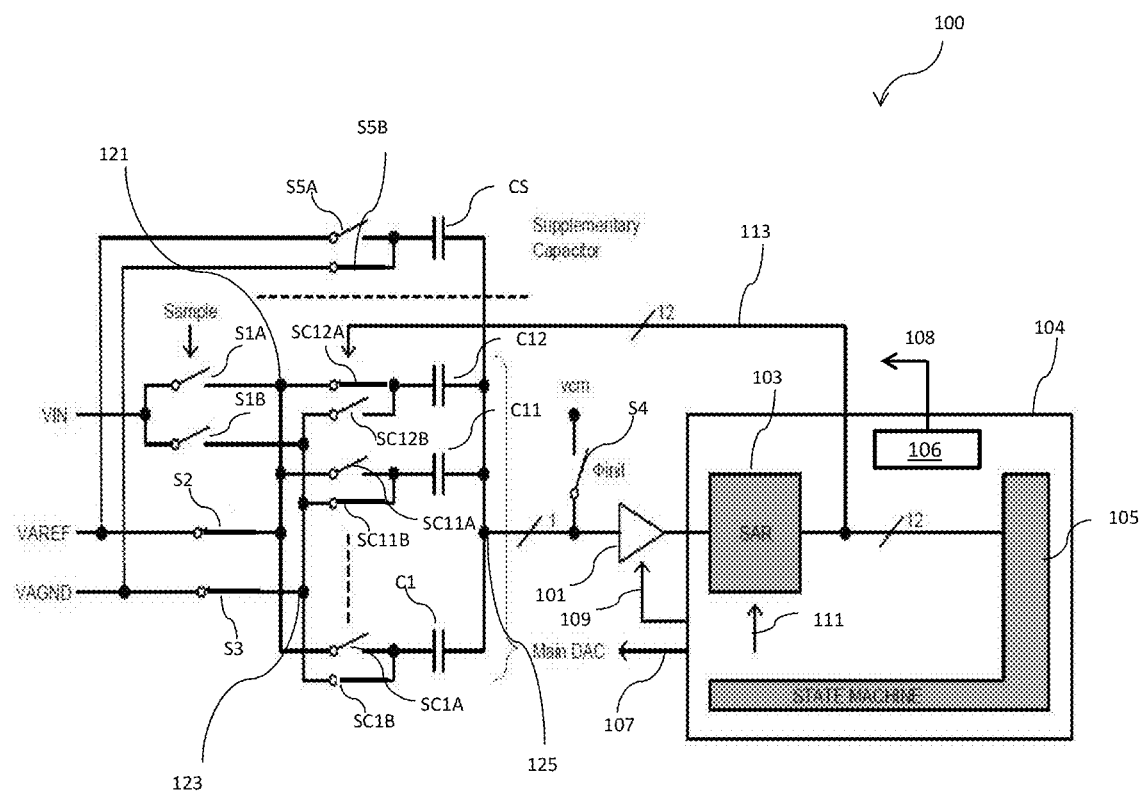

FIGS. 3A and 3B illustrate the sampling phase and the conversion phase of the normal operation mode of the ADC 100, respectively, in an embodiment. During the normal operation mode, the switch $S_{5A}$ stays open, and the switch $S_{5B}$ stays closed, thereby grounding the supplemental capacitor CS and deactivating the supplemental DAC circuit 140. Note that in the illustrated embodiment, when the supplemental DAC circuit 140 is deactivated in normal mode, its function is bypassed and there is no switching of the switches $S_{5A}$ and $S_{5B}$ in the normal mode, but the supplemental DAC circuit 140 is still connected to the main DAC circuit 150. One skilled in the art will readily appreciate that during operation, a switched-capacitor ADC (e.g., a successive approximation ADC) functions in two phases: a sampling phase followed by a conversion phase. Details of the different phases are discussed below.

FIG. 3A illustrates the sampling phase of the normal operation mode of the ADC 100, in an embodiment. During the sampling phase of FIG. 3A, switches $S_4$, $S_{1A}$, $S_{1B}$, $SC_{1A}$, $SC_{1B}$, $SC_{2A}$, $SC_{2B}$, . . . , $SC_{12A}$, and $SC_{12B}$ are closed, and switches $S_2$ and $S_3$ are open. As a result, the array of binary-weighted capacitors (e.g., $C_1$, $C_2$, . . . , $C_{12}$) are coupled to the input voltage $V_{IN}$ and charged, and each capacitor now holds a charge equal to its capacitance times the input voltage VIN minus the low-bias voltage $V_{cm}$.

Next, in FIG. 3B, the ADC 100 enters the conversion phase, where the SAR circuit 104 searches through each bit of the ADC output code in a successive approximation process. During the conversion phase, switches $S_4$, $S_{1A}$, and $S_{1B}$, are open, and switches $S_2$ and $S_3$ are closed. The status (e.g., open or close) of the array of paired switches (e.g., $SC_{1A}$, $SC_{1B}$, $SC_{2A}$, $SC_{2B}$, . . . , $SC_{12A}$, and $SC_{12B}$) are controlled by the ADC output code stored in the SAR 103 during the successive approximation process. Note that each capacitor in the array of binary-weighted capacitors corresponds to a respective bit in the ADC output code, with the smallest capacitor C1 corresponding to the LSB of the ADC output code, and the largest capacitor (e.g., C12) corresponding to the MSB of the ADC output code. FIG. 3B shows the status of the switches during testing of the MSB bit.

In the conversion phase, first, the SAR circuit 104 determines the MSB bit (e.g., bit 12). The MSB capacitor (e.g., C12) is coupled to the first reference voltage $V_{AREF}$ (e.g., a full-scale input voltage) by closing the switch SC12A and opening the switches SC12B. The other capacitors (C1, C2, . . . , C11) in the array of binary-weighted capacitors are coupled to the second reference voltage $V_{AGND}$ (e.g., the electrical ground) by opening the switch $SC_{nA}$ and closing the switch $SC_{nB}$, where n=1, 2, . . . , 11. Note that the switch $S_4$ is open during the conversion phase.

Due to the binary-weighting of the array of binary-weighted capacitors, the MSB capacitor C12 forms a 1:1 charge divider with the rest of the array. Thus, the input voltage to the comparator 101 (e.g., voltage at the output 125 of the main DAC circuit), is proportional to $(V_{AREF}/2)-V_{IN}$. In other words, the main DAC circuit 150 generates, at the output 125, a voltage proportional to a difference between a first voltage (e.g., $V_{AREF}/2$) and an input voltage $V_{IN}$, where the first voltage is a voltage that corresponds to the current ADC output code (e.g., 100 . . . 0 in binary format) stored in the SAR 103. If $V_{IN}$ is greater than $V_{REF}/2$, then the comparator 101 outputs a zero, and the SAR circuit 104 set the MSB of the ADC output code as a digital bit 1, otherwise the SAR circuit 104 set the MSB of the ADC output code as a digital bit 0. Once the MSB bit is determined, the switches $SC_{12A}$ and $SC_{12B}$ are set accordingly. For example, for an MSB of digital bit 1, the switch $SC_{12A}$ is closed, and the switch $SC_{12B}$ is open. The status of the switches $SC_{12A}$ and $SC_{12F}$ are flipped to the opposite for an MSB of digital bit 0.

After the MSB bit is determined, the SAR circuit 104 determines the next bit (e.g., bit 11), following similar processing for the MSB bit. Each capacitor in the array of binary-weighted capacitors is tested in the same manner until the comparator input voltage converges to zero, or at least as close as possible given the resolution of the DAC. The ADC output code stored in the SAR 103 after the LSB is determined is the final ADC output code.

Figure 4A:
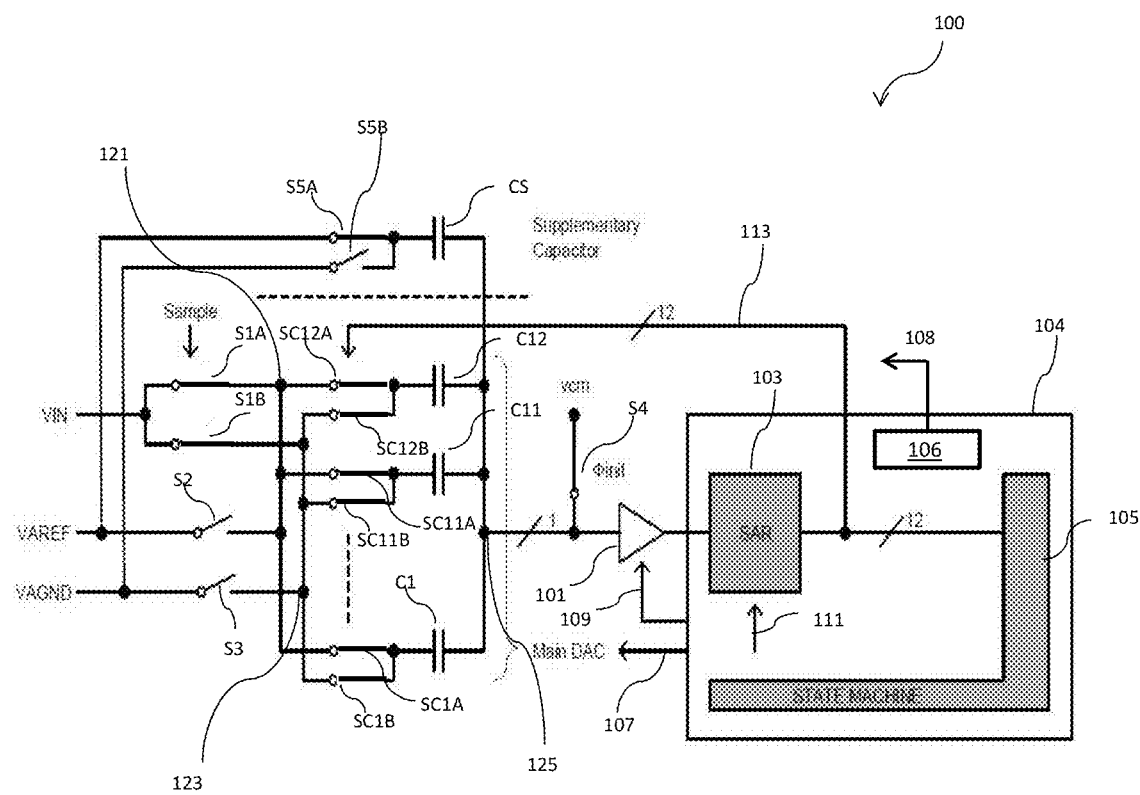
FIGS. 4A and 4B illustrate the sampling phase and the conversion phase, respectively, of a modified zero-crossing mode of the ADC of FIG. 2B, in an embodiment.
Figure 4B:
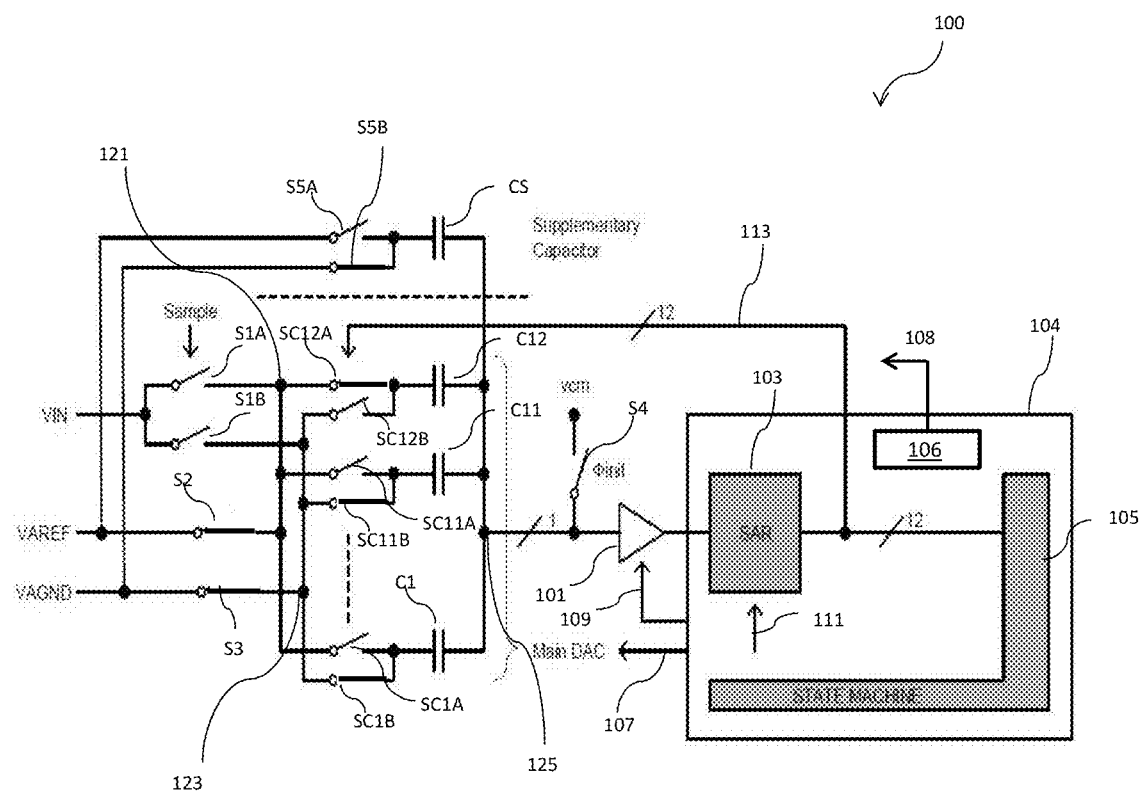

FIGS. 4A and 4B illustrate the sampling phase and the conversion phase, respectively, of a modified zero-crossing mode of the ADC 100, in an embodiment. The modified zero-crossing mode is used for measuring the offset of the ADC 100, thus may also be referred to as an offset measurement mode.

FIG. 4A illustrates the sampling phase of the modified zero-crossing mode of the ADC 100. The main DAC circuit 150 in FIG. 4A operates in a same manner as the main DAC circuit in the sampling phase of the normal operation mode in FIG. 3A. The supplementary DAC circuit 140 is now activated. In particular, the switch $S_{5A}$ is closed, and the switch $S_{5B}$ is open, thereby coupling the supplemental capacitor CS to the first reference voltage $V_{AREF}$ (e.g., a full-scale input voltage). As a result, the supplemental capacitor CS is charged during the sampling phase.

Next, in FIG. 4B, the ADC 100 enters the conversion phase of the modified zero-crossing mode of the ADC 100. The main DAC circuit in FIG. 4B operates in the same manner as the main DAC circuit in the conversion phase of the normal operation mode in FIG. 3B. In the conversion phase of FIG. 4B, the switch $S_{5A}$ is open, and the switch $S_{5B}$ is closed. As a result, the supplemental capacitor CS injects charge to the capacitors C1, C2, . . . , C11 of the array of binary-weighted capacitors, and as a result, shifts (e.g., decreases) the voltage at the output 125 of the main DAC circuit, which effectively moves the DC transfer curve upward. The amount of voltage shift is determined by the capacitance of the supplemental capacitor CS. As discussed above, if the capacitance of the supplemental capacitor CS is, e.g., 16C (which is the capacitance of the capacitor C5), then the DC transfer curve is shifted upwards by 16. By changing the capacitance of the supplemental capacitor CS, a target amount of shift in the DC transfer curve is achieved.

Figure 5A:
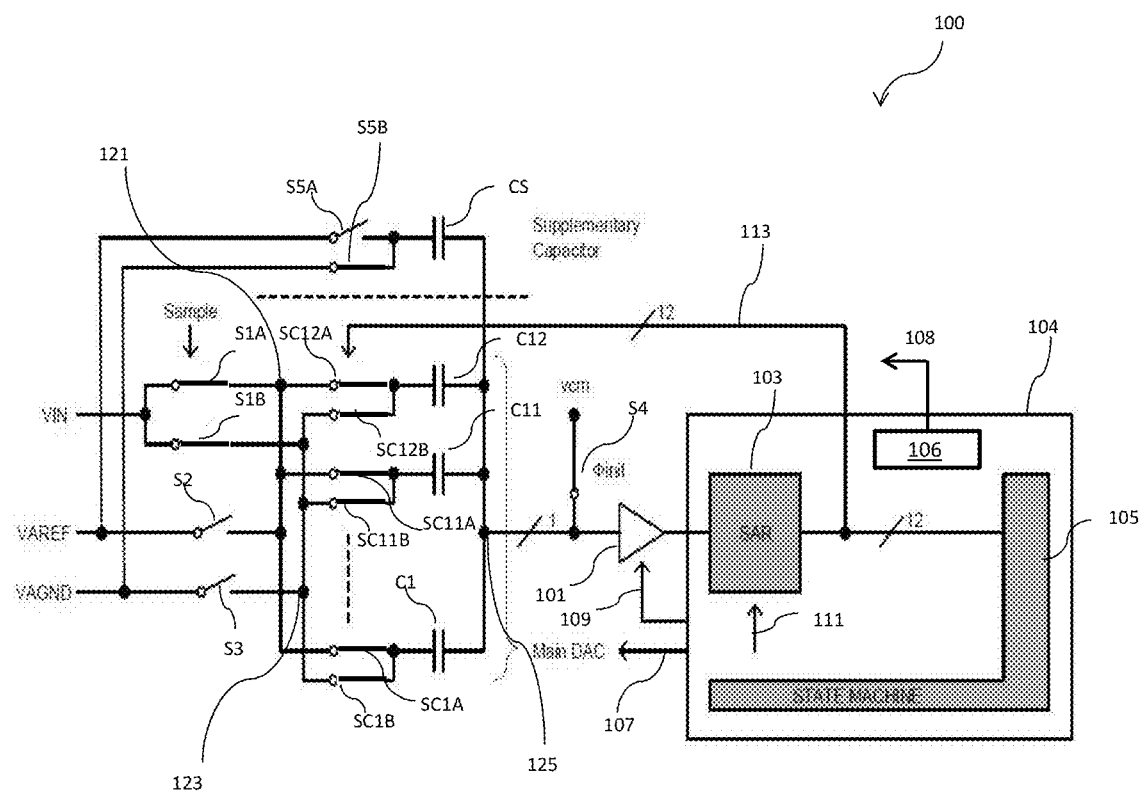
FIGS. 5A and 5B illustrate the sampling phase and the conversion phase, respectively, of a modified full-scale crossing mode of the ADC of FIG. 2B, in an embodiment.
Figure 5B:
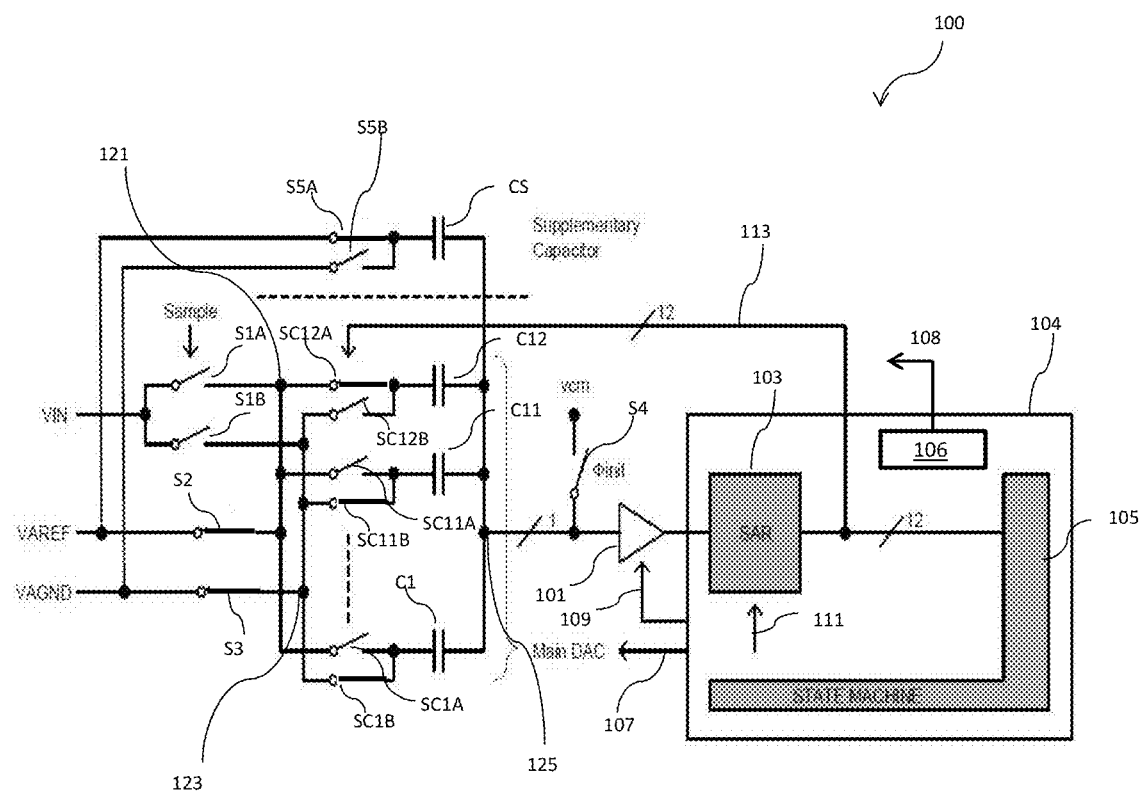

FIGS. 5A and 5B illustrate the sampling phase and the conversion phase, respectively, of a modified full-scale crossing mode of the ADC 100, in an embodiment. The modified full-scale crossing mode is used for measuring the full-scale gain error of the ADC 100, thus may also be referred to as a full-scale gain error measurement mode. The modified full-scale crossing mode and the modified zero-crossing mode may be collectively referred to as the testing mode of the ADC 100.

FIG. 5A illustrates the sampling phase of the modified full-scale crossing mode of the ADC 100. The main DAC circuit in FIG. 5A operates in a same manner as the main DAC circuit in the sampling phase of the normal operation mode in FIG. 3A. The supplementary DAC circuit is now activated. In particular, the switch $S_{5A}$ is open, and the switch $S_{5B}$ is closed, thereby coupling the supplemental capacitor CS to the second reference voltage $V_{AGND}$ (e.g., electrical ground) during the sampling phase.

Next, in FIG. 5B, the ADC 100 enters the conversion phase of the modified full-scale crossing mode of the ADC 100. The main DAC circuit in FIG. 5B operates in the same manner as the main DAC circuit in the conversion phase of the normal operation mode in FIG. 3B. In the conversion phase of FIG. 5B, the switch $S_{5A}$ is closed, and the switch $S_{5B}$ is open. As a result, the supplemental capacitor CS is coupled in parallel to the MSB capacitor C12 (during testing of the MSB capacitor C12), and causes redistribution of charge in the capacitors in the array. As a result, the voltage at the output 125 of the main DAC circuit is shifted (e.g., increased), which effectively moves the DC transfer curve downward. The amount of voltage shift is determined by the capacitance of the supplemental capacitor CS. As discussed above, if the capacitance of the supplemental capacitor CS is, e.g., 16C (which is the capacitance of the capacitor C5), then the DC transfer curve is shifted downward by 16. By changing the capacitance of the supplemental capacitor CS, a target amount of shift in the DC transfer curve is achieved.

Figure 6:
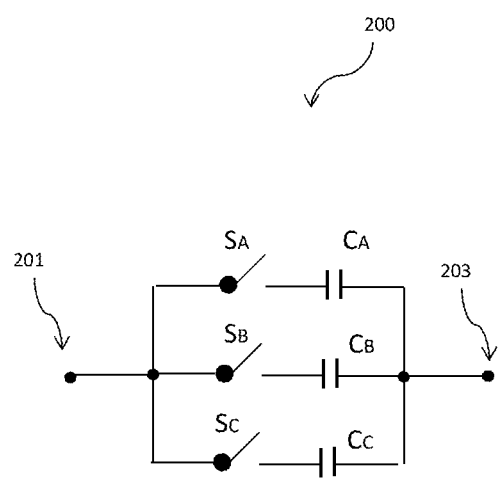
FIG. 6 illustrates a re-configurable capacitor, in an embodiment.

FIG. 6 illustrates a capacitor 200, in an embodiment. The capacitor 200 includes a plurality of capacitors, e.g., $C_A$, $C_B$, and $C_C$ with different capacitance values, and switches $S_A$, $S_B$, and $S_C$ connected to the capacitors. By changing the status (e.g., open or close) of the switches $S_A$, $S_B$, and $S_C$, the equivalent capacitance of the capacitor 200 between terminals 201 and 203 may be changed to different values. Therefore, the capacitor 200 is an adjustable capacitor, or a re-configurable capacitor. The capacitor 200 may be used as the supplementary capacitor CS of FIG. 2B, which will allow the amount of shift in the DC transfer curve to be adjusted or be re-configurable. The number of capacitors in FIG. 6 is merely a non-limiting example, other numbers are also possible and are fully intended to be included within the scope of the present disclosure.

FIG. 7 illustrates a flow chart of a method of operating a successive approximation ADC device, in an embodiment. It should be understood that the embodiment method shown in FIG. 7 is merely an example of many possible embodiment methods. One of ordinary skill in the art would recognize many variations, alternatives, and modifications. For example, various steps as illustrated in FIG. 7 may be added, removed, replaced, rearranged, or repeated.

Referring to FIG. 7, at step 1001, a DC transfer curve of a switched-capacitor ADC is shifted in a first direction by a pre-determined value during measurement of an offset of the switched-capacitor ADC with a zero-voltage input. At step 1002, the DC transfer curve of the switched-capacitor ADC is shifted in a second direction opposite the first direction by the pre-determined value during measurement of a full-scale gain error of the switched-capacitor ADC with a full-scale voltage input.

Embodiments may achieve advantages. For example, the disclosed ADC with the built-in supplementary DAC circuit allows for direct measurement of the offset (or full-scale gain error) of the ADC in a single measurement, thus achieving simple and quick measurement not afforded by previous methods. In addition, since electrical ground voltage and the full-scale reference voltage are readily available on the circuit board that the ADC device is attached to, no high-precision analog voltage sources are needed to perform the offset and full-scale gain error measurements. This simplifies the test setup and requirements, as well as lowering the cost of testing. The ability to quickly measure the offset and the full-scale gain error of the ADC using on-board voltages (e.g., on the circuit board without the need for extra high-accuracy analog source for testing) provides a way to quickly identify non-functioning (e.g., damaged) ADC devices in the field, thus enabling quick repair or replacement. Further, the disclosed structure and methods could be used with a simple ATE to measure the Integral Non-Linearity (INL) and Differential Non-Linearity (DNL) of a high accuracy ADC, following the discharge method disclosed in U.S. Pat. No. 9,787,291B1.

Example embodiments of the present invention are summarized here. Other embodiments can also be understood from the entirety of the specification and the claims filed herein.

Example 1

In an embodiment, a switched-capacitor analog-to-digital converter (ADC) includes: a main digital-to-analog converter (DAC) circuit having an output; a comparator having an input coupled to the output of the main DAC circuit, the comparator configured to determine whether the input to the comparator exceeds a pre-determined threshold; and a supplementary DAC circuit coupled to the main DAC circuit, wherein the switched-capacitor ADC is configured to operate in at least one of a first mode or a second mode, wherein in the first mode for measuring an offset of the switched-capacitor ADC with a zero voltage input, the supplementary DAC circuit is configured to shift a voltage at the output of the main DAC circuit by a first value having a first polarity, and wherein in the second mode for measuring a full-scale gain error of the switched-capacitor ADC with a full-scale input voltage, the supplementary DAC circuit is configured to shift the voltage at the output of the main DAC circuit by a second value having a second polarity opposite the first polarity.

Example 2

The switched-capacitor ADC of example 1, wherein the supplementary DAC circuit is configured to be deactivated in a normal operation mode for measuring an input voltage of the switched-capacitor ADC.

Example 3

The switched-capacitor ADC of example 1, wherein an amplitude of the first value is a same as an amplitude of the second value.

Example 4

The switched-capacitor ADC of example 1, wherein the supplementary DAC circuit comprises at least one supplemental capacitor.

Example 5

The switched-capacitor ADC of example 4, wherein the main DAC comprises at least one capacitor and wherein a capacitance of the at least one supplemental capacitor is equal to a capacitance of the at least one capacitor of the main DAC.

Example 6

The switched-capacitor ADC of example 4, wherein a capacitance of the at least one supplemental capacitor is re-configurable.

Example 7

The switched-capacitor ADC of example 4, wherein a first terminal of the at least one supplemental capacitor is coupled to the output of the main DAC circuit, and a second terminal of the at least one supplemental capacitor is coupled to a first node, where the switched-capacitor ADC further comprises: a first switch between the first node and a first reference voltage input terminal of the switched-capacitor ADC; and a second switch between the first node and a second reference voltage input terminal of the switched-capacitor ADC.

Example 8

The switched-capacitor ADC of example 7, wherein the first reference voltage input terminal is configured to be coupled to a positive reference voltage of the switched-capacitor ADC, and the second reference voltage input terminal is configured to be coupled to an electrical ground voltage or to a negative reference voltage of the switched-capacitor ADC.

Example 9

The switched-capacitor ADC of example 7, wherein during a normal operation mode to convert an input voltage of the switched-capacitor ADC into an output code, the first switch is configured to stay open, and the second switch is configured to stay closed.

Example 10

The switched-capacitor ADC of example 1, wherein the switched-capacitor ADC is a successive approximation ADC, wherein the main DAC circuit comprises an array of capacitors, wherein each capacitor corresponds to a respective bit in an output code of the successive approximation ADC, wherein a capacitance $C_n$ of an n-th capacitor in the array of capacitors is $2^{(n-1)} \times C$, where n=1, 2, . . . , N, where N is a total number of bits in the output code of the successive approximation ADC, and C is a pre-determined capacitance value.

Example 11

The switched-capacitor ADC of example 1, wherein the switched-capacitor ADC is configured to determine at least one of the offset or the full-scale gain error of the switched-capacitor ADC based on a first reference voltage received at a first reference voltage input terminal and based on a second reference voltage received at a second reference voltage input terminal.

Example 12

The switched-capacitor ADC of example 1, wherein the switched-capacitor ADC is configured to determine at least one of the offset or the full-scale gain error during at least one of testing mode or normal operation mode.

Example 13

A switched-capacitor analog-to-digital converter (ADC) includes: a main digital-to-analog converter (DAC) circuit having an output; a comparator coupled to the output of the main DAC circuit; and a supplementary DAC circuit. The supplementary DAC circuit includes: at least one supplementary capacitor, wherein a first terminal of the at least one supplementary capacitor is coupled to the output of the main DAC circuit; a first switch coupled between a second terminal of the at least one supplementary capacitor and a first reference voltage terminal of the switched-capacitor ADC; and a second switch coupled between the second terminal of the at least one supplementary capacitor and a second reference voltage terminal of the switched-capacitor ADC.

Example 14

The switched-capacitor ADC of example 13, wherein the first reference voltage terminal is configured to be coupled to a positive reference voltage of the switched-capacitor ADC, and the second reference voltage terminal is configured to be coupled to an electrical ground voltage or to a negative reference voltage of the switched-capacitor ADC.

Example 15

The switched-capacitor ADC of example 13, wherein the switched-capacitor ADC is a successive approximation ADC, wherein the main DAC circuit comprises: an array of capacitors, wherein a first terminal of each capacitor of the array of capacitors is coupled to the output of the main DAC circuit, wherein a second terminal of each capacitor of the array of capacitors is configured to, at different phases of operation of the successive approximation ADC, be coupled to an input voltage terminal of the successive approximation ADC, the first reference voltage terminal of the successive approximation ADC, or the second reference voltage terminal of the successive approximation ADC; and an array of paired switches, wherein each paired switch of the array of paired switches comprises a first switch and a second switch, a first terminal of the first switch of the paired switch and a first terminal of the second switch of the paired switch being coupled to the second terminal of a respective capacitor of the array of capacitors, a second terminal of the first switch of the paired switch being coupled to a first node, and a second terminal of the second switch of the paired switch being coupled to a second node.

Example 16

The switched-capacitor ADC of example 15, wherein the main DAC circuit further comprises: a third switch coupled between the first node and the input voltage terminal; a fourth switch coupled between the second node and the input voltage terminal; a fifth switch coupled between the first node and the first reference voltage terminal; and a sixth switch coupled between the second node and the second reference voltage terminal.

Example 17

The switched-capacitor ADC of example 16, wherein the main DAC circuit further comprises a seventh switch coupled between the output of the main DAC circuit and a low bias voltage terminal of the switched-capacitor ADC.

Example 18

A method of operating a switched-capacitor analog-to-digital converter (ADC) includes at least one of: shifting a DC transfer curve of the switched-capacitor ADC in a first direction by a pre-determined value during measurement of an offset of the switched-capacitor ADC with a zero-voltage input; and shifting the DC transfer curve of the switched-capacitor ADC in a second direction opposite the first direction by the pre-determined value during measurement of a full-scale gain error of the switched-capacitor ADC with a full-scale voltage input.

Example 19

The method of example 18, wherein shifting the DC transfer curve in the first direction comprises: during a sampling phase of the switched-capacitor ADC: connecting first ends of an array of capacitors of a main digital-to-analog converter (DAC) circuit of the switched-capacitor ADC to an input voltage terminal, and connecting second ends of the array of capacitors to a low-bias voltage terminal; and connecting a first end of a supplementary capacitor of a supplementary DAC circuit of the switched-capacitor ADC to a first reference voltage terminal, and connecting a second end of the supplementary capacitor to the low-bias voltage terminal; and during a conversion phase of the switched-capacitor ADC: connecting the first ends of the array of capacitors to the first reference voltage terminal or to an electrical ground terminal based on a corresponding bit in an ADC output code generated by a switched-capacitor register (SAR) circuit of the switched-capacitor ADC, and connecting the second ends of the array of capacitors to an input of a comparator of the switched-capacitor ADC, the comparator being coupled between the array of capacitors and the SAR circuit; and connecting the first end of the supplementary capacitor to the electrical ground terminal and connecting the second end of the supplementary capacitor to the input of the comparator.

Example 20

The method of example 19, wherein shifting the DC transfer curve in the second direction comprises: during the sampling phase of the switched-capacitor ADC: connecting the first ends of the array of capacitors to the input voltage terminal, and connecting the second ends of the array of capacitors to the low-bias voltage terminal; and connecting the first end of the supplementary capacitor to the electrical ground terminal, and connecting the second end of the supplementary capacitor to the low-bias voltage terminal; and during the conversion phase of the switched-capacitor ADC: connecting the first ends of the array of capacitors to the first reference voltage terminal or to the electrical ground terminal based on the corresponding bit in the ADC output code generated by the SAR circuit, and connecting the second ends of the array of capacitors to the input of the comparator; and connecting the first end of the supplementary capacitor to the first reference voltage terminal and connecting the second end of the supplementary capacitor to the input of the comparator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A switched-capacitor analog-to-digital converter (ADC) comprising:
a main digital-to-analog converter (DAC) circuit having an output;
a comparator having an input coupled to the output of the main DAC circuit, the comparator configured to determine whether the input to the comparator exceeds a pre-determined threshold; and
a supplementary DAC circuit coupled to the main DAC circuit, wherein the switched-capacitor ADC is configured to operate in at least one of a first mode or a second mode, wherein in the first mode for measuring an offset of the switched-capacitor ADC with a zero voltage input, the supplementary DAC circuit is configured to shift a voltage at the output of the main DAC circuit by a first value having a first polarity, and wherein in the second mode for measuring a full-scale gain error of the switched-capacitor ADC with a full-scale input voltage, the supplementary DAC circuit is configured to shift the voltage at the output of the main DAC circuit by a second value having a second polarity opposite the first polarity.

2. The switched-capacitor ADC of claim 1, wherein the supplementary DAC circuit is configured to be deactivated in a normal operation mode for measuring an input voltage of the switched-capacitor ADC.

3. The switched-capacitor ADC of claim 1, wherein an amplitude of the first value is a same as an amplitude of the second value.

4. The switched-capacitor ADC of claim 1, wherein the supplementary DAC circuit comprises at least one supplemental capacitor.

5. The switched-capacitor ADC of claim 4, wherein the main DAC comprises at least one capacitor and wherein a capacitance of the at least one supplemental capacitor is equal to a capacitance of the at least one capacitor of the main DAC.

6. The switched-capacitor ADC of claim 4, wherein a capacitance of the at least one supplemental capacitor is re-configurable.

7. The switched-capacitor ADC of claim 4, wherein a first terminal of the at least one supplemental capacitor is coupled to the output of the main DAC circuit, and a second terminal of the at least one supplemental capacitor is coupled to a first node, where the switched-capacitor ADC further comprises:
  a first switch between the first node and a first reference voltage input terminal of the switched-capacitor ADC; and
  a second switch between the first node and a second reference voltage input terminal of the switched-capacitor ADC.

8. The switched-capacitor ADC of claim 7, wherein the first reference voltage input terminal is configured to be coupled to a positive reference voltage of the switched-capacitor ADC, and the second reference voltage input terminal is configured to be coupled to an electrical ground voltage or to a negative reference voltage of the switched-capacitor ADC.

9. The switched-capacitor ADC of claim 7, wherein during a normal operation mode to convert an input voltage of the switched-capacitor ADC into an output code, the first switch is configured to stay open, and the second switch is configured to stay closed.

10. The switched-capacitor ADC of claim 1, wherein the switched-capacitor ADC is a successive approximation ADC, wherein the main DAC circuit comprises an array of capacitors, wherein each capacitor corresponds to a respective bit in an output code of the successive approximation ADC, wherein a capacitance $C_n$ of an n-th capacitor in the array of capacitors is $2^{(n-1)} \times C$, where n=1, 2, . . . , N, where N is a total number of bits in the output code of the successive approximation ADC, and C is a pre-determined capacitance value.

11. The switched-capacitor ADC of claim 1, wherein the switched-capacitor ADC is configured to determine at least one of the offset or the full-scale gain error of the switched-capacitor ADC based on a first reference voltage received at a first reference voltage input terminal and based on a second reference voltage received at a second reference voltage input terminal.

12. The switched-capacitor ADC of claim 1, wherein the switched-capacitor ADC is configured to determine at least one of the offset or the full-scale gain error during at least one of testing mode or normal operation mode.

13. A switched-capacitor analog-to-digital converter (ADC) comprising:
  a main digital-to-analog converter (DAC) circuit having an output;
  a comparator coupled to the output of the main DAC circuit; and
  a supplementary DAC circuit comprising:
    at least one supplementary capacitor, wherein a first terminal of the at least one supplementary capacitor is coupled to the output of the main DAC circuit;
    a first switch coupled between a second terminal of the at least one supplementary capacitor and a first reference voltage terminal of the switched-capacitor ADC; and
    a second switch coupled between the second terminal of the at least one supplementary capacitor and a second reference voltage terminal of the switched-capacitor ADC.

14. The switched-capacitor ADC of claim 13, wherein the first reference voltage terminal is configured to be coupled to a positive reference voltage of the switched-capacitor ADC, and the second reference voltage terminal is configured to be coupled to an electrical ground voltage or to a negative reference voltage of the switched-capacitor ADC.

15. The switched-capacitor ADC of claim 13, wherein the switched-capacitor ADC is a successive approximation ADC, wherein the main DAC circuit comprises:
  an array of capacitors, wherein a first terminal of each capacitor of the array of capacitors is coupled to the output of the main DAC circuit, wherein a second terminal of each capacitor of the array of capacitors is configured to, at different phases of operation of the successive approximation ADC, be coupled to an input voltage terminal of the successive approximation ADC, the first reference voltage terminal of the successive approximation ADC, or the second reference voltage terminal of the successive approximation ADC; and
  an array of paired switches, wherein each paired switch of the array of paired switches comprises a first switch and a second switch, a first terminal of the first switch of the paired switch and a first terminal of the second switch of the paired switch being coupled to the second terminal of a respective capacitor of the array of capacitors, a second terminal of the first switch of the paired switch being coupled to a first node, and a second terminal of the second switch of the paired switch being coupled to a second node.

16. The switched-capacitor ADC of claim 15, wherein the main DAC circuit further comprises:
  a third switch coupled between the first node and the input voltage terminal;
  a fourth switch coupled between the second node and the input voltage terminal;
  a fifth switch coupled between the first node and the first reference voltage terminal; and
  a sixth switch coupled between the second node and the second reference voltage terminal.

17. The switched-capacitor ADC of claim 16, wherein the main DAC circuit further comprises a seventh switch coupled between the output of the main DAC circuit and a low bias voltage terminal of the switched-capacitor ADC.

18. A method of operating a switched-capacitor analog-to-digital converter (ADC), the method comprising at least one of:
- shifting a DC transfer curve of the switched-capacitor ADC in a first direction by a pre-determined value during measurement of an offset of the switched-capacitor ADC with a zero-voltage input; and
- shifting the DC transfer curve of the switched-capacitor ADC in a second direction opposite the first direction by the pre-determined value during measurement of a full-scale gain error of the switched-capacitor ADC with a full-scale voltage input.

19. The method of claim 18, wherein shifting the DC transfer curve in the first direction comprises:
- during a sampling phase of the switched-capacitor ADC:
  - connecting first ends of an array of capacitors of a main digital-to-analog converter (DAC) circuit of the switched-capacitor ADC to an input voltage terminal, and connecting second ends of the array of capacitors to a low-bias voltage terminal; and
  - connecting a first end of a supplementary capacitor of a supplementary DAC circuit of the switched-capacitor ADC to a first reference voltage terminal, and connecting a second end of the supplementary capacitor to the low-bias voltage terminal; and
- during a conversion phase of the switched-capacitor ADC:
  - connecting the first ends of the array of capacitors to the first reference voltage terminal or to an electrical ground terminal based on a corresponding bit in an ADC output code generated by a switched-capacitor register (SAR) circuit of the switched-capacitor ADC, and connecting the second ends of the array of capacitors to an input of a comparator of the switched-capacitor ADC, the comparator being coupled between the array of capacitors and the SAR circuit; and
  - connecting the first end of the supplementary capacitor to the electrical ground terminal and connecting the second end of the supplementary capacitor to the input of the comparator.

20. The method of claim 19, wherein shifting the DC transfer curve in the second direction comprises:
- during the sampling phase of the switched-capacitor ADC:
  - connecting the first ends of the array of capacitors to the input voltage terminal, and connecting the second ends of the array of capacitors to the low-bias voltage terminal; and
  - connecting the first end of the supplementary capacitor to the electrical ground terminal, and connecting the second end of the supplementary capacitor to the low-bias voltage terminal; and
- during the conversion phase of the switched-capacitor ADC:
  - connecting the first ends of the array of capacitors to the first reference voltage terminal or to the electrical ground terminal based on the corresponding bit in the ADC output code generated by the SAR circuit, and connecting the second ends of the array of capacitors to the input of the comparator; and
  - connecting the first end of the supplementary capacitor to the first reference voltage terminal and connecting the second end of the supplementary capacitor to the input of the comparator.

* * * * *